(12) United States Patent
Huang et al.

(10) Patent No.: US 12,557,692 B2
(45) Date of Patent: Feb. 17, 2026

(54) SEMICONDUCTOR PACKAGING ASSEMBLY AND SEMICONDUCTOR PACKAGING STRUCTURE

(71) Applicant: Powertech Technology Inc., Hukou (TW)

(72) Inventors: Kun-Yung Huang, Hukou (TW); Jen-I Huang, Hukou (TW)

(73) Assignee: Powertech Technology Inc., Hsinchu (TW)

( * ) Notice: Subject to any disclaimer, the term of this patent is extended or adjusted under 35 U.S.C. 154(b) by 794 days.

(21) Appl. No.: 17/840,209

(22) Filed: Jun. 14, 2022

(65) Prior Publication Data

US 2023/0223311 A1 Jul. 13, 2023

(30) Foreign Application Priority Data

Jan. 7, 2022 (TW) .................................. 111100790

(51) Int. Cl.
*H01L 23/31* (2006.01)
*H01L 23/00* (2006.01)

(52) U.S. Cl.
CPC .......... *H01L 23/3192* (2013.01); *H01L 24/05* (2013.01); *H01L 2224/02331* (2013.01); *H01L 2224/02371* (2013.01); *H01L 2224/0239* (2013.01)

(58) Field of Classification Search
CPC ................. H01L 23/3192; H01L 24/05; H01L 2224/02331; H01L 2224/02371; H01L 2224/0239; H01L 23/13; H01L 23/49816; H01L 23/49822; H01L 23/562; H01L 21/561; H01L 23/3128
See application file for complete search history.

(56) References Cited

U.S. PATENT DOCUMENTS

| | | | |
|---|---|---|---|
| 11,127,691 B2* | 9/2021 | Kothari | ............. H01L 21/76232 |
| 2014/0248745 A1* | 9/2014 | Wu | .......................... H01L 25/50 |
| | | | 438/114 |
| 2015/0155248 A1* | 6/2015 | Lin | .......................... H01L 21/56 |
| | | | 257/737 |
| 2017/0053902 A1* | 2/2017 | Yu | .......................... H01L 23/481 |
| 2021/0066254 A1* | 3/2021 | Yu | ............................ H01L 23/13 |

* cited by examiner

*Primary Examiner* — Jonathan Han
(74) *Attorney, Agent, or Firm* — Burris Law, PLLC (57) ABSTRACT

A semiconductor packaging assembly includes a redistribution layered structure having a plurality of device regions and a plurality of cutting regions separating the device regions, a plurality of recess structures respectively formed in the cutting regions, a plurality of chips respectively disposed in the device regions, and an encapsulating layer formed on the redistribution layered structure to fill the recess structures and enclose the chips.

20 Claims, 8 Drawing Sheets

SEMICONDUCTOR PACKAGING ASSEMBLY AND SEMICONDUCTOR PACKAGING STRUCTURE

CROSS-REFERENCE TO RELATED APPLICATION

This application claims priority of Taiwanese Invention Patent Application No. 111100790, filed on Jan. 7, 2022.

FIELD

The disclosure relates to a semiconductor packaging assembly and a semiconductor packaging structure, more particularly to a fan-out semiconductor packaging assembly and a semiconductor packaging structure obtained therefrom.

BACKGROUND

Fan-out packaging structures are widely used in the industry due to the advantages on miniaturization of a semiconductor device and reduction of package cost. In particular, a redistribution layer first (RDL-first) technology is one of a process for making the fan-out packaging structures. In such a process, a redistribution layered structure, which includes a plurality of dielectric layers and conductive layers, is formed on a surface of a carrier, and then a plurality of chips are electrically connected to the redistribution layered structure with active regions thereof facing toward the redistribution layered structure. Afterwards, the resulted structure is covered with an epoxy molding compound (EMC), which forms an encapsulating layer on the redistribution layered structure and which encloses the chips, to form a semiconductor packaging assembly. Finally, the semiconductor packaging assembly is cut along a periphery of each of the chips so as to form individual semiconductor packaging structures.

However, the dielectric layers of the redistribution layered structure are usually made of polyimide (PI), which is a polymer material different from EMC used for packaging. Since polyimide and EMC easily absorb moisture and have different coefficients of thermal expansion (CTE), they cannot match each other, thereby reducing the bonding strength between polyimide and EMC. Therefore, the dielectric layers and the EMC may be separated during the subsequent reliability test or subsequent application, so that peel-off or delamination appears in the semiconductor packaging structure and thus the product yield is reduced.

SUMMARY

Therefore, an object of the disclosure is to provide a semiconductor packaging assembly and a semiconductor packaging structure that can alleviate at least one of the drawbacks of the prior art.

According to a first aspect of the disclosure, a semiconductor packaging assembly includes a redistribution layered structure, a plurality of recess structures, a plurality of chips and an encapsulating layer. The redistribution layered structure has a top surface, a bottom surface opposite to the top surface, a plurality of device regions and a plurality of cutting regions separating the device regions. Each of the cutting regions is disposed between two adjacent ones of the device regions. Each of the recess structures has at least one recess and is formed in a respective one of the cutting regions of the redistribution layered structure. The at least one recess is recessed into the redistribution layered structure from the top surface. Each of the chips is disposed on a respective one of the device regions of the redistribution layered structure and is electrically connected to the redistribution layered structure. The encapsulating layer is formed on the redistribution layered structure to fill the recess structures and enclose the chips.

According to a second aspect of the disclosure, a semiconductor packaging structure includes a redistribution layered structure, a recess structure, a chip and an encapsulating layer. The redistribution layered structure has a top surface and a bottom surface opposite to the top surface, and the top surface has a peripheral portion. The recess structure has at least one recess and is formed at the peripheral portion of the top surface. The at least one recess is recessed into the redistribution layered structure from the top surface. The chip is disposed on the top surface of the redistribution layered structure and is electrically connected to the redistribution layered structure. The encapsulating layer is formed on the redistribution layered structure to fill the at least one recess and enclose the chip. The encapsulating layer has a cut surface, and the recess structure is adjacent to the cut surface.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Before the disclosure is described in greater detail, it should be noted that where considered appropriate, reference numerals or terminal portions of reference numerals have been repeated among the figures to indicate corresponding or analogous elements, which may optionally have similar characteristics.

Figure 1:
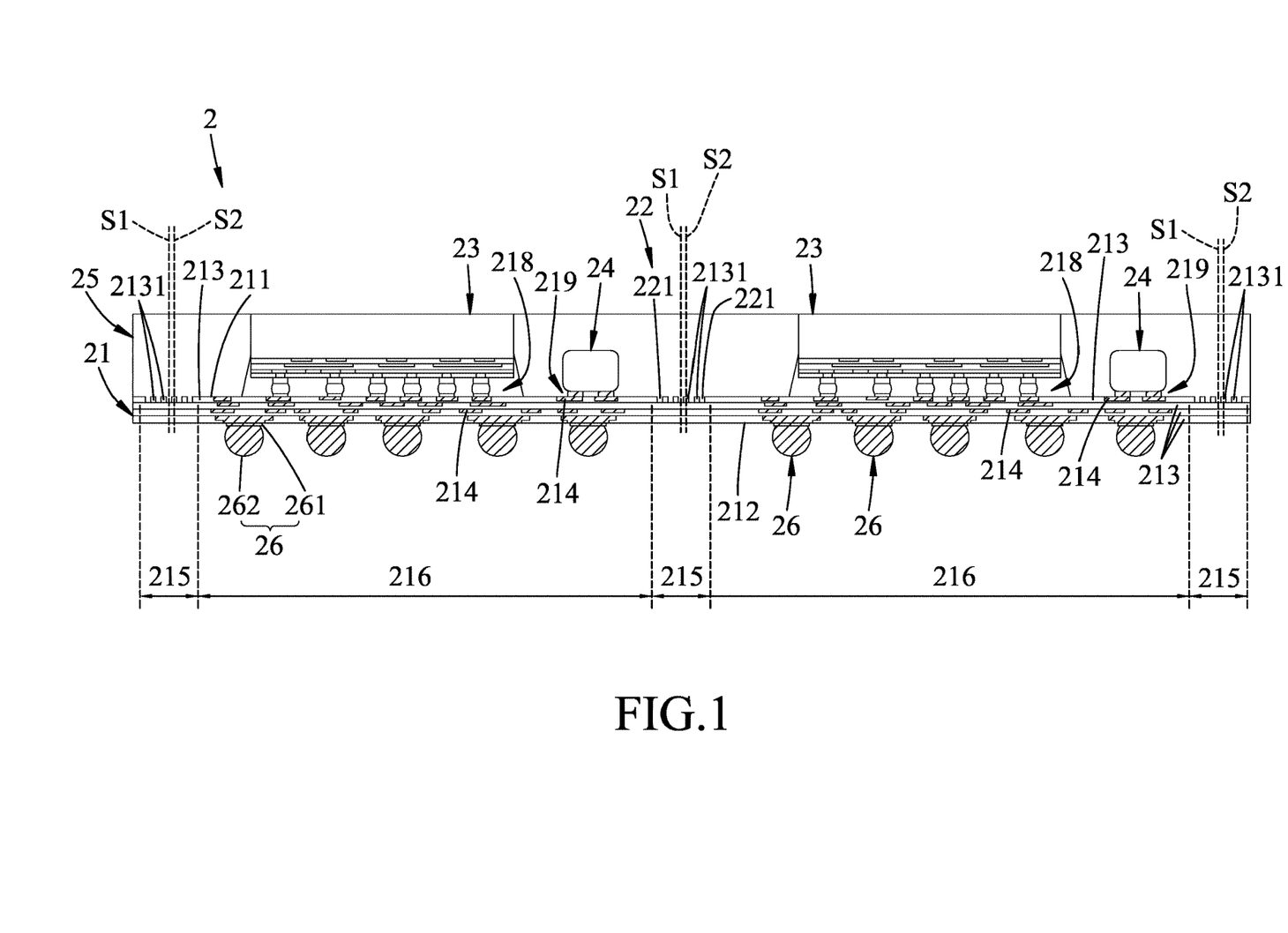
FIG. 1 is a partially sectional view illustrating an embodiment of a semiconductor packaging assembly according to the disclosure.

Referring to FIG. 1, an embodiment of a semiconductor packaging assembly 2 is illustrated. The semiconductor packaging assembly 2 includes a redistribution layered structure 21, a plurality of recess structures 22 formed in the redistribution layered structure 21, a plurality of chips 23 and a plurality of passive elements 24 formed on the redistribution layered structure 21, and an encapsulating layer 25 which is formed on the redistribution layered structure 21 and which covers the chips 23. The redistribution layered structure 21 has a top surface 211, a bottom surface 212 opposite to the top surface 211, a plurality of device regions 216, and a plurality of cutting regions 215 separating the device regions 216. That is, each of the device regions 216 is disposed between two adjacent ones of the cutting regions 215.

The redistribution layered structure 21 includes a plurality of dielectric layers 213 and a plurality of patterned metal layers 214. Each of the dielectric layers 213 is made of an insulating material. Each of the patterned metal layers 214 is formed in a respective one of the dielectric layers 213 by printing or plating. In this embodiment, each of the dielectric layers 213 is made of polyimide (PI). The topmost one and the bottommost one of the dielectric layers 213 in the redistribution layered structure 21 respectively form the top surface 211 and the bottom surface 212.

Each of the recess structures 22 has at least one recess 221 and is formed in a respective one of the cutting regions 215 of the redistribution layered structure 21. The at least one recess 221 is recessed into the redistribution layered structure 21 from the top surface 211. It should be noted that the depth of the recess 221 may be adjusted according to demands. In one example, the at least one recess 221 only extends through the topmost dielectric layer 213. In other example, the at least one recess 221 extends through the topmost dielectric layer 213 into an intermediate one of the dielectric layers 213 of the redistribution layered structure 21. In another example, the at least one recess 221 extends through the redistribution layered structure 21 from the top surface 211 to the bottom surface 212.

It should be noted that the number and the shape of the recess 221 of each of the recess structures 22 may be also adjusted according to requirements. Furthermore, the configuration of the recesses 221 of the recess structures 22 may be the same or different. In this embodiment, the redistribution layered structure 21 has a plurality of dielectric segments 2131 located in each of the cutting regions 215, and each recess structure 22 has a plurality of the recesses 221 separated from one another by the dielectric segments 2131. Each of the recesses 221 of each of the recess structures 22 has the same dimensions in a direction from the top surface 211 toward the bottom surface 212, and extends through the topmost dielectric layer 213.

Figure 2A:
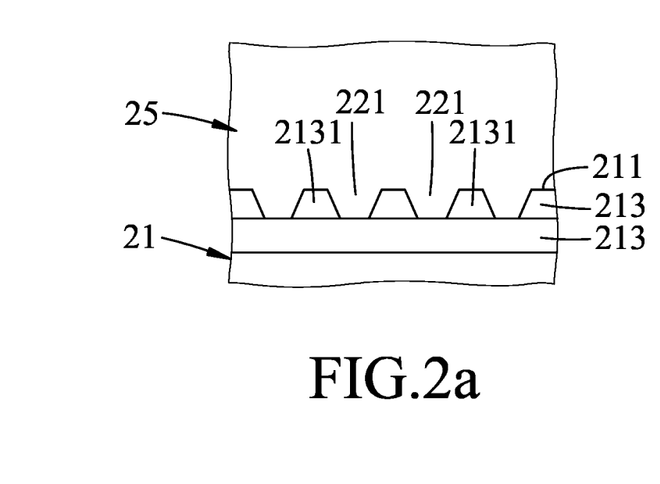
FIGS. 2a and 2b are fragmentary schematic views respectively illustrating two configurations of a recess structure applicable in the embodiment of the semiconductor packaging assembly of FIG. 1.
Figure 2B:
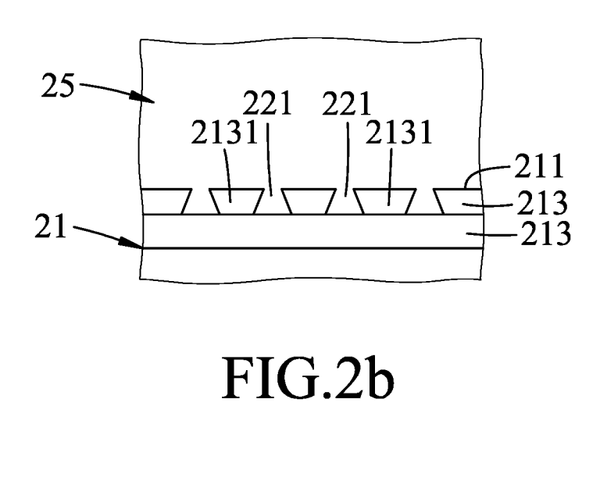

Referring to FIGS. 2a and 2b, two different configurations of the recesses 221 of each of the recess structures 21 applicable in the semiconductor packaging assembly 2 are illustrated. In FIG. 2a, each of the recesses 221 has dimensions gradually reduced in a direction from the top surface 211 toward the bottom surface 212 (see FIG. 1). Such configuration would have less adverse effect on the thickness uniformity of the redistribution layered structure 21. In FIG. 2b, each of the recesses 221 has dimensions gradually increased in a direction from the top surface 211 toward the bottom surface 212 (see FIG. 1). In this configuration, the encapsulating layer 25 filled into the recesses 221 may have an anchor form, thereby further enhancing the bonding strength between the redistribution layered structure 21 and the encapsulating layer 25.

Figure 3:
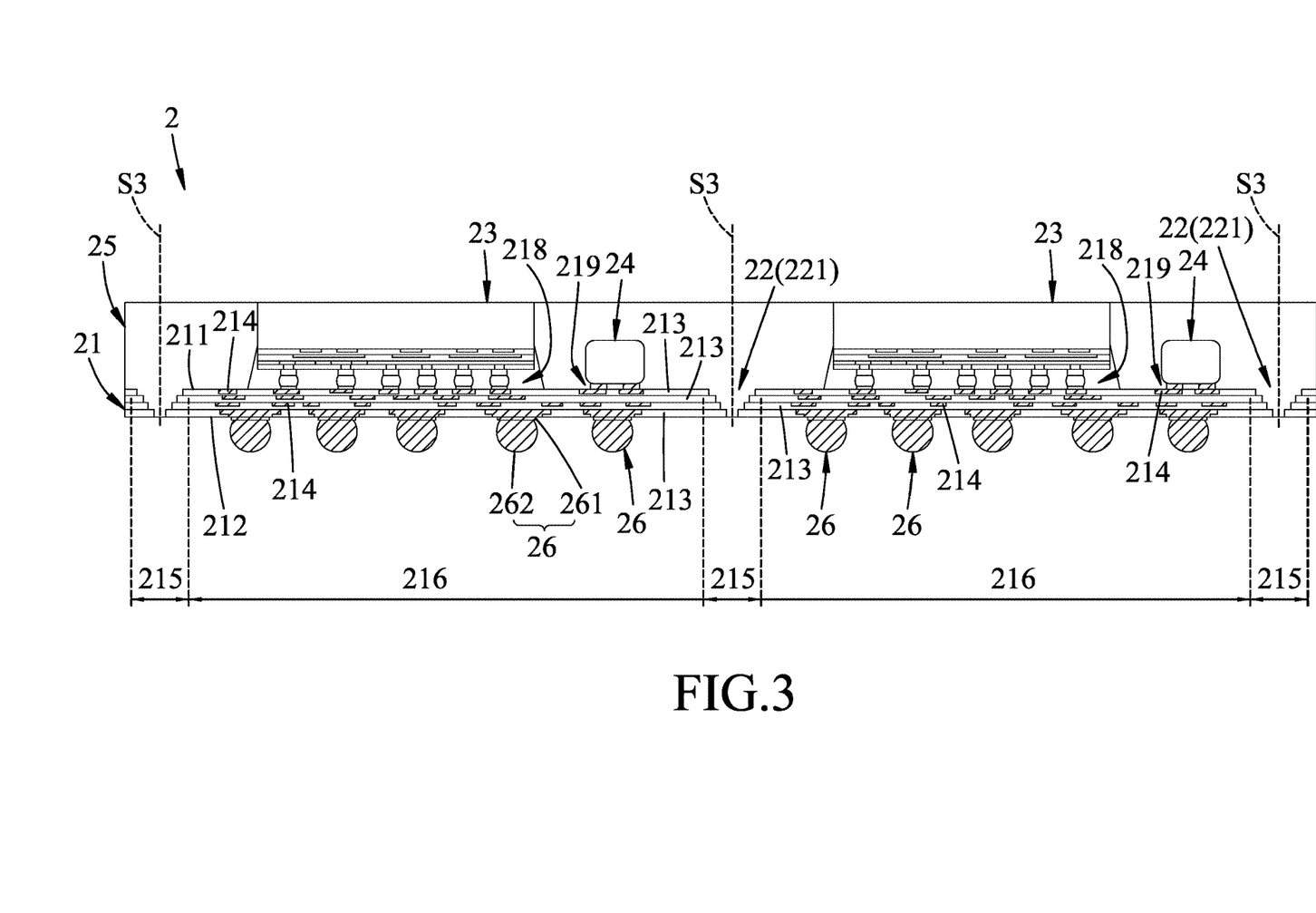
FIGS. 3 and 4 are partially sectional views illustrating another configurations of the recess structure in the embodiment of the semiconductor packaging assembly of the disclosure.
Figure 4:
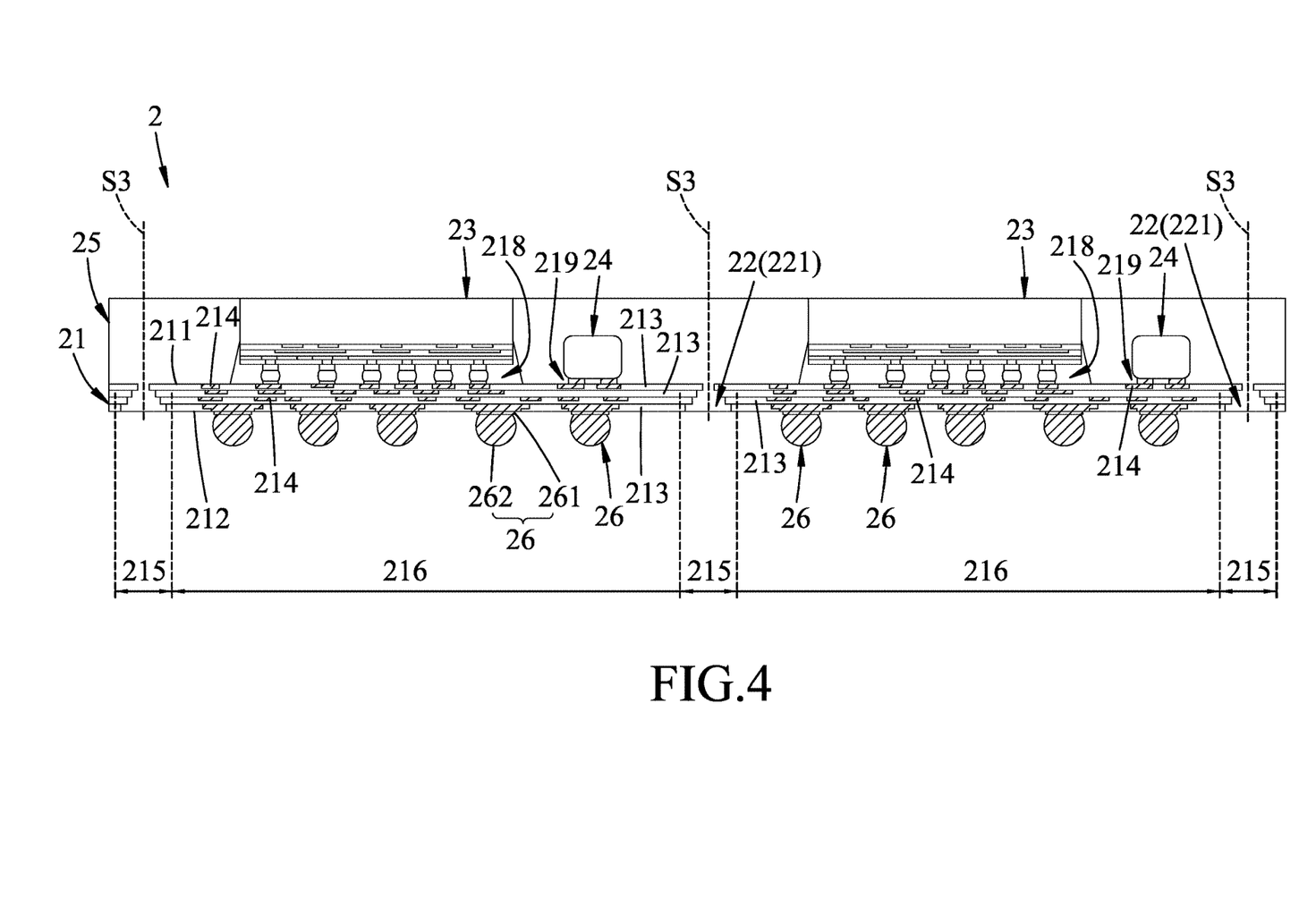

In certain embodiments, as shown in FIG. 3, each of the recess structures 22 has only one recess 212 which extends through the redistribution layered structure 21 from the top surface 211 to the bottom surface 212, which has dimensions gradually reduced in a direction from the top surface 211 toward the bottom surface 212, and which is in a stepwise shape. Particularly, in the embodiment shown in FIG. 3, each of the dielectric layers 213 has a length in a direction parallel to the top surface 211, and the lengths of the dielectric layers 213 gradually increase from the topmost one to the bottommost one, so that the redistribution layered structure 21 has a stepwise side edge. Alternatively, as shown in FIG. 4, the recess 221 of each recess structure 22 may have dimensions gradually reduced in a direction from the bottom surface 212 toward the top surface 211, so that the recess 221 has a stepwise shape viewed from the bottom surface 212. With the stepwise-shape configuration, portions of the encapsulating layer 25 filled into the stepwise-shape recesses 221 may have dimensions gradually decreased or increased in a direction from the top surface 211 toward the bottom surface 212. Therefore, when the cutting of the semiconductor packaging assembly 2 is conducted in a direction from the top surface 211 toward the bottom surface 212, the portions of the encapsulating layer 25 filled in the stepwise-shape recesses 221 may function as buffer regions against the stress induced by cutting, thereby preventing deformation of the redistribution layered structure 21.

Each of the chips 23 is disposed on a respective one of the device regions 216 of the redistribution layered structure 21, and is electrically connected to the redistribution layered structure 21 through a plurality of connecting ports 218. To be specific, each of the chips 23 is disposed on the top surface 211 of the redistribution layered structure 21 in the respective one of the device regions 216, and is separated from one another by the cutting regions 215. Each of the connecting ports 218 is made of metal.

The passive elements 24 are disposed on the device regions 216 of the redistribution layered structure 21. In this embodiment, each of the passive elements 24 is disposed on the respective one of the device regions 216 of the top surface 211 of the redistribution layered structure 21. Each of the passive elements 24 is electrically connected to the redistribution layered structure 21 through a plurality of connecting ports 219. Each of the passive elements 24 may be, but not limited to, a capacitor, an inductor or a transformer. It should be noted that the passive elements 24 may be omitted according to demands.

The encapsulating layer 25 is formed on the redistribution layered structure 21 to fill the recess structures 22 and enclose the chips 23 and the passive elements 24. The encapsulating layer 25 may be made of a material different from that of the dielectric layers 213. In this embodiment, the encapsulating layer 25 is made of epoxy. Portions of the encapsulating layer 25 filled into spaces between two adjacent one of the chips 24 form fan-out regions. Thus, the semiconductor packaging assembly 2 is of a fan-out package type. Since, in this embodiment, each of the recesses 221 extends into the redistribution layered structure 21, and since the encapsulating layer 25 is filled in the recesses 221, the influence caused by subsequent cutting between the dielectric layers 213 of the redistribution layered structure 21 may be reduced. In addition, with the formation of the recesses 221, the bonding strength between the redistribution layered structure 21 and the encapsulating layer 25 may be enhanced, and the influence on the thickness uniformity of the redistribution layered structure 21 may be reduced.

The semiconductor packaging assembly 2 further includes a plurality of electrically connecting units 26, each of which is formed on the bottom surface 212 of the redistribution layered structure 21 and is adapted to electrically connect to other electronic elements. Each of the electrically connecting units 26 has an electrically connecting pad 261 formed on the bottom surface 212, and a solder ball 262 formed on the electrically connecting pad 261. The electrically connecting pad 261 is electrically connected a corresponding one of the patterned metal layers 214 which is formed in the bottommost dielectric layer 213, such that the electrically connecting units 26 are electrically connected to the chips 23 or the passive elements 24 through the redistribution layered structure 21.

Figure 5:
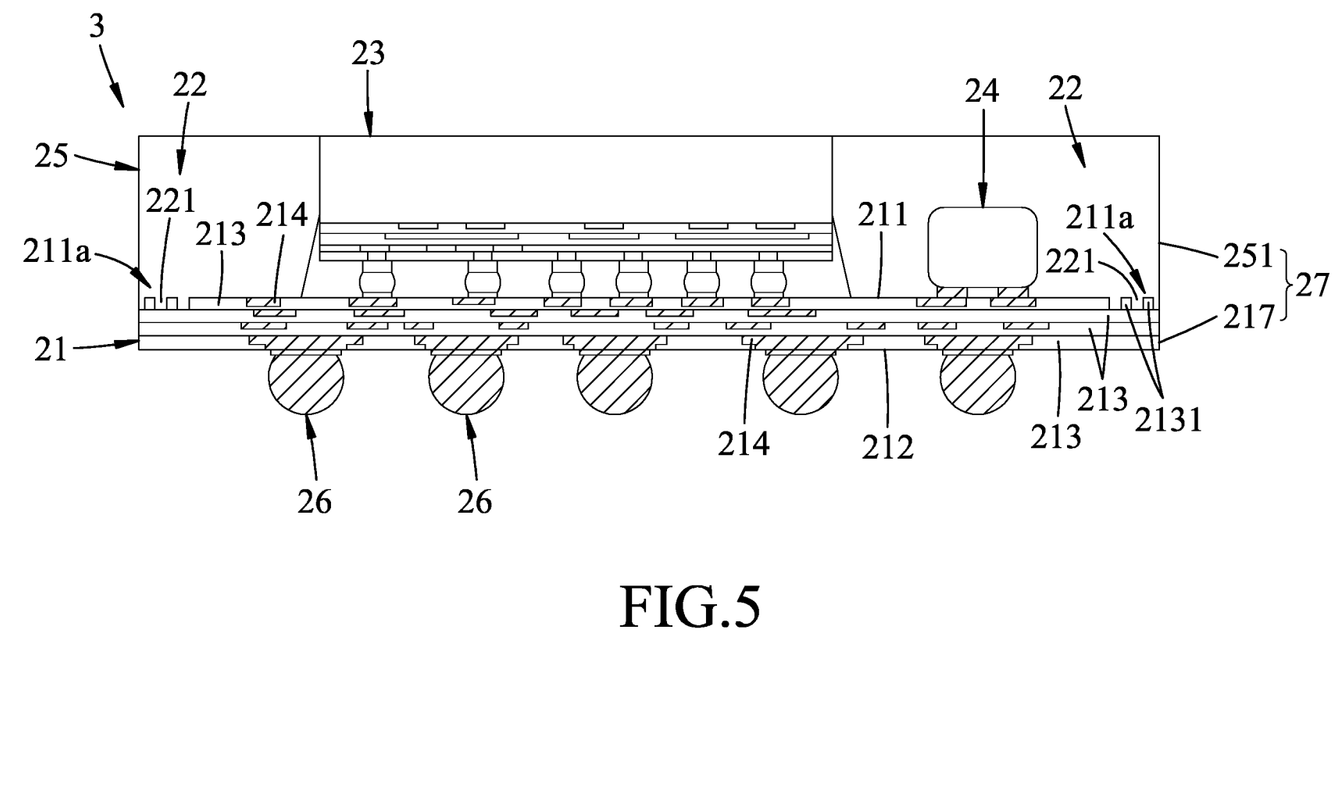
FIG. 5 is a partially sectional view illustrating a first embodiment of a semiconductor packaging structure according to the disclosure.
Figure 6:
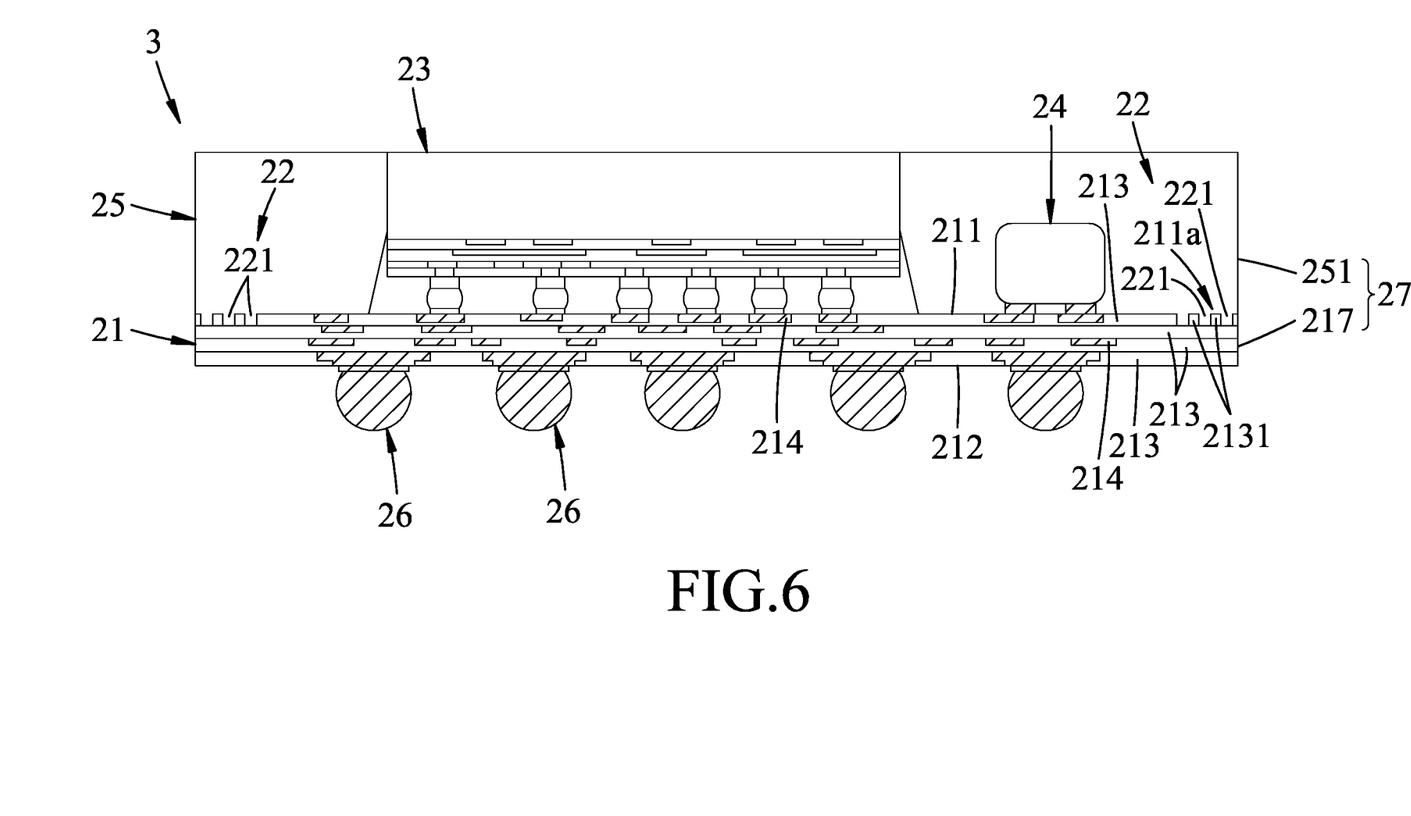
FIG. 6 is a partially sectional view illustrating a second embodiment of a semiconductor packaging structure according to the disclosure.

Referring to FIGS. 5 and 6, first and second embodiments of a semiconductor packaging structure 3 are illustrated. The semiconductor packaging structures 3 shown in FIGS. 5 and 6 are formed by cutting the semiconductor packaging assembly 2 of FIG. 1 along first cutting lines (S1) and/or second cutting lines (S2), respectively. Each of the first cutting lines (S1) is defined to penetrate through a portion of the encapsulating layer 25 filled in a respective one of the recess structures 22. Each of the second cutting lines (S2) is defined to penetrate through one of the dielectric segments 2131 of a respective one of the redistribution layered structure 21. Since the semiconductor packaging structures 3 of FIGS. 5 and 6 are formed from the semiconductor packaging assembly 2 of FIG. 1, the detailed descriptions of the semiconductor packaging structures 3 would not be repeated for clarity, and only the features on cutting surfaces along the first and second cutting lines (S1 and S2) of the semiconductor packaging structures 3 will be illustrated.

In FIG. 5, the semiconductor packaging structure 3 includes the redistribution layered structure 21, the recess structure 22, the chip 23 and the encapsulating layer 25. The top surface 211 of the redistribution layered structure 21 has a peripheral portion (211a), and the dielectric segments 2131 of the redistribution layered structure 21 are located at the peripheral portion (211a). The encapsulating layer 25 has a cut surface 251 which is formed by cutting along the first cutting line (S1) (see FIG. 1), and the recess structure 22 is adjacent to the cut surface 251. The redistribution layered structure 21 has a side surface 217 which is flush with the cut surface 251 of the encapsulating layer 25. A portion of the encapsulating layer 25 filled in the recess structure 21 forms a part of the cut surface 251 of the encapsulating layer 25 (i.e., portion of the encapsulating layer 25 filled in the recess structure 21 is cut in the cutting procedure). The side surface 217 of the redistribution layered structure 21 and the cut surface 251 of the encapsulating layer 25 cooperatively form a cutting end face 27 of the semiconductor packaging structure 3.

In FIG. 6, the cut surface 251 of the encapsulating layer 25 is formed by cutting along the second cutting line (S2) (see FIG. 1). The side surface 217 of the redistribution layered structure 21 is flush with the cut surface 251 of the encapsulating layer 25. Since the second cutting line (S2) is penetrated through the one of the dielectric segments 2131, the one of the dielectric segments 2131 forms a part of the side surface 217 of the redistribution layered structure 21 (i.e., the one of the dielectric segments 2131 is cut in the cutting procedure).

No matter the cutting procedure is conducted along the first or second cutting lines (S1 or S2), both of the semiconductor packaging structures 3 of FIGS. 5 and 6 have enhanced bonding strength between the encapsulating layer 25 and the redistribution layered structure 21 since the encapsulating layer 25 is filled in the recess structure 22. It should be noted that, the semiconductor packaging structures 3 may be obtained by cutting the semiconductor packaging assembly 2 along the first and second cutting lines (S1, S2), so that the semiconductor packaging structures 3 simultaneously have the configurations of the cutting end face 27, as shown in FIGS. 5 and 6 (i.e., a part of the cutting end face 27 having the configuration shown in FIG. 4, and a part of the cutting end face 27 having the configuration shown in FIG. 6).

Figure 7:
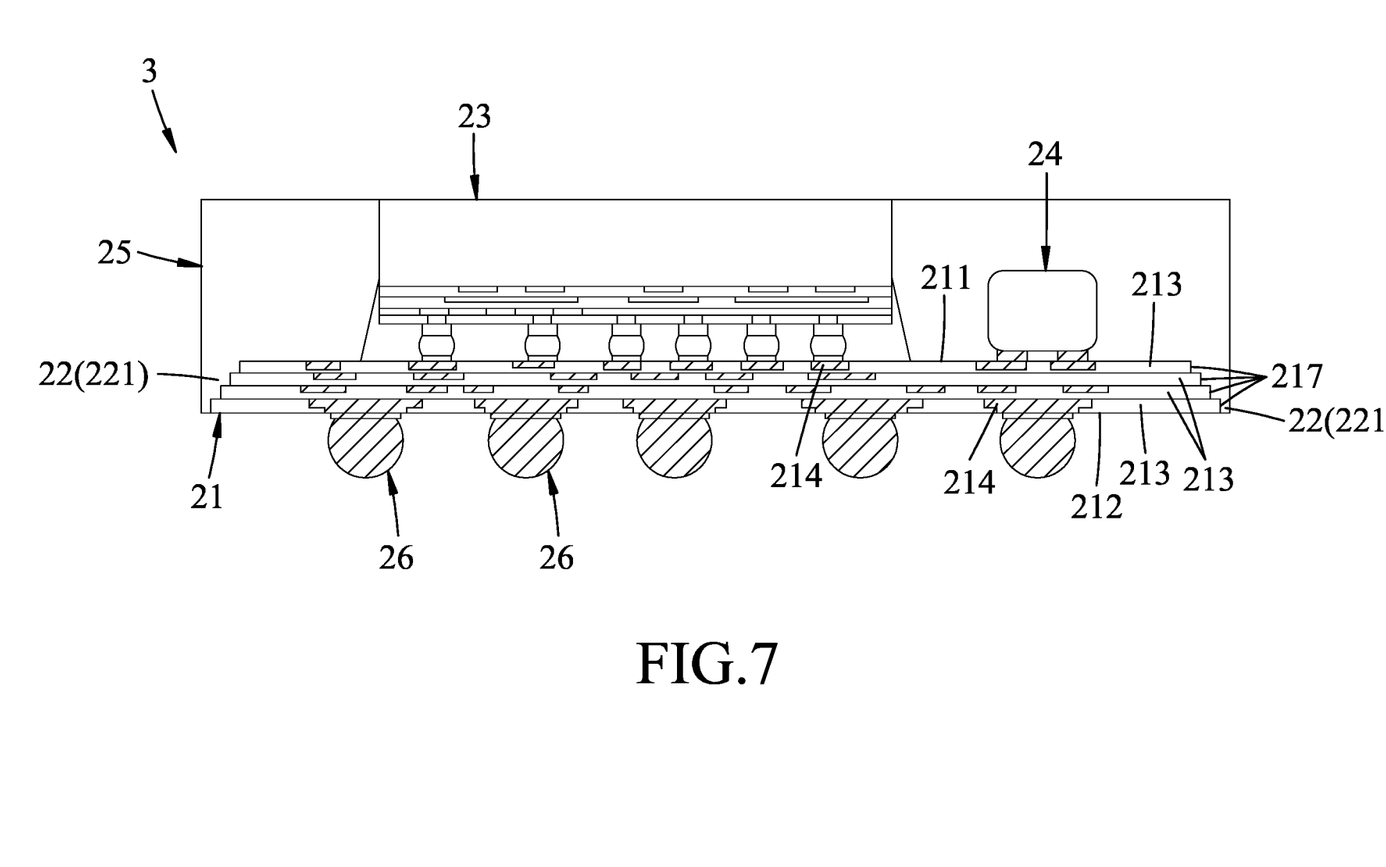
FIG. 7 is a partially sectional view illustrating a third embodiment of a semiconductor packaging structure according to the disclosure.

Referring to FIG. 7, a third embodiment of a semiconductor packaging structure 3 is illustrated. The semiconductor packaging structure 3 is formed by cutting the semiconductor packaging assembly 2 of FIG. 3 along third cutting lines (S3). Each of the third cutting lines (S3) is defined to penetrate through the recess 221 having the stepwise shape. Since the semiconductor packaging structures 3 of FIG. 7 is formed from the semiconductor packaging assembly 2 of FIG. 3, the detailed descriptions of the semiconductor packaging structures 3 would not be repeated for clarity, and only the features on cutting surface along the third cutting lines (S3) of the semiconductor packaging structures 3 will be illustrated.

In FIG. 7, the redistribution layered structure 21 has a side surface 217 which is between the top surface 211 and the bottom surface 212 and is in a stepwise form viewed from the top surface 211 toward the bottom surface 212, and the encapsulating layer 25 surrounds the side surface 217 of the redistribution layered structure 21. Since the redistribution layered structure 21 is fully surrounded by the encapsulating layer 25, moisture absorption by the redistribution layered structure 21 may be alleviated, thereby avoiding the CTE mismatch problem occurred in the prior art. Moreover, as mentioned above, the portions of the encapsulating layer 25 filled in the stepwise-shape recesses 221 may function as buffer regions against the stress induced by cutting, thereby preventing deformation of the redistribution layered structure 21.

Figure 8:
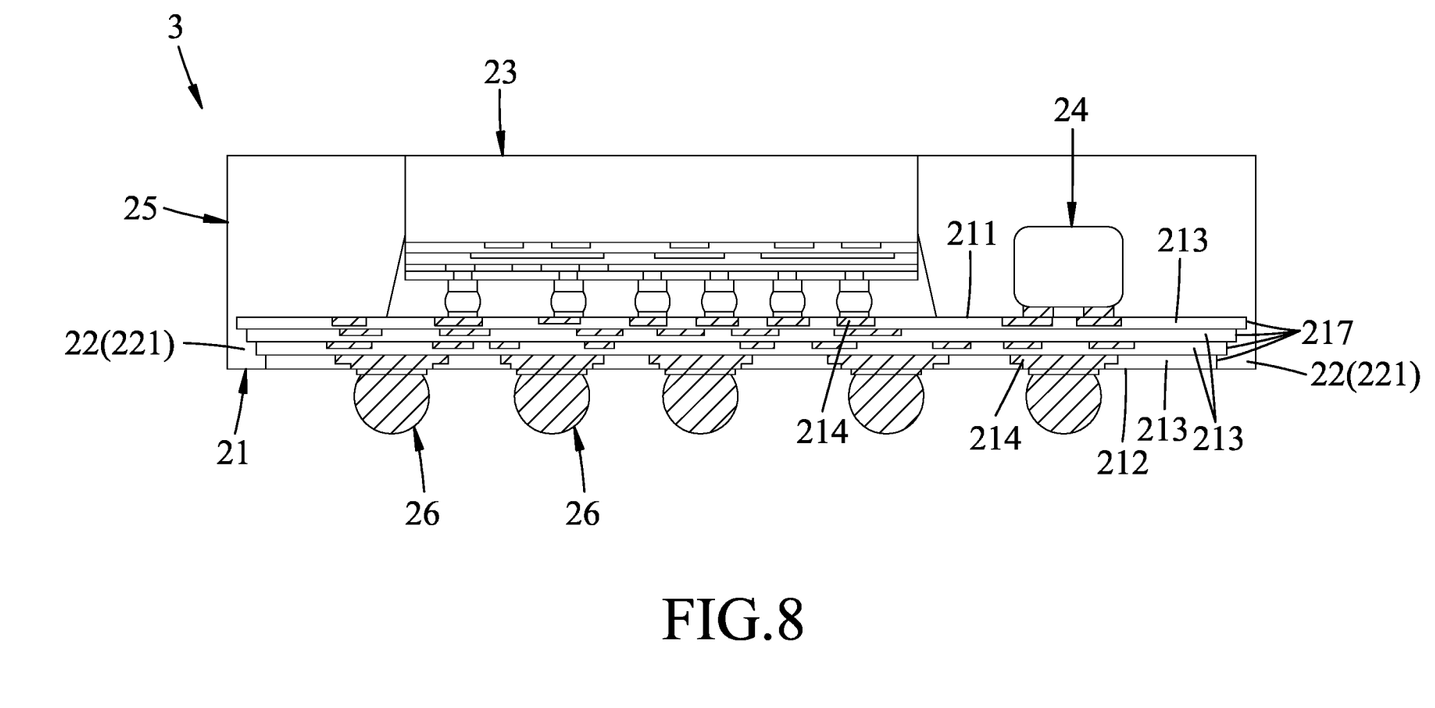
FIG. 8 is a partially sectional view illustrating a fourth embodiment of a semiconductor packaging structure according to the disclosure.

Referring to FIG. 8, a fourth embodiment of a semiconductor packaging structure 3 is illustrated. The semiconductor packaging structure 3 is formed by cutting the semiconductor packaging assembly 2 of FIG. 4 along third cutting lines (S3), and is similar to the semiconductor packaging structure 3 of FIG. 7 except that the side surface 217 is in a stepwise form viewed from the bottom surface 212 toward the top surface 211.

To sum up, with the encapsulation layer 25 filled into the recess structure 21, the bonding strength between the redistribution layered structure 21 and the encapsulation layer 25 is enhanced, so that the peel-off or delamination in the semiconductor packaging assembly 2 during cutting process may be avoided. Moreover, the thickness uniformity of the redistribution layered structure 21 would not be seriously affected due to the configuration among the recess structure 22, the redistribution layered structure 21 and the encapsulating layer 25.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A semiconductor packaging assembly, comprising:
a redistribution layered structure which has a top surface, a bottom surface opposite to said top surface, a plurality of device regions, and a plurality of cutting regions separating said device regions;
a plurality of recess structures each of which has at least one recess and is formed in a respective one of said cutting regions of said redistribution layered structure, said at least one recess being recessed into said redistribution layered structure and extending in a direction from said top surface toward said bottom surface within said redistribution layered structure, said at least one recess not extending beyond said redistribution layered structure;
a plurality of chips each of which is disposed on a respective one of said device regions of said redistribution layered structure and is electrically connected to said redistribution layered structure; and
an encapsulating layer which is formed on said redistribution layered structure to fill said recess structures and which encloses said chips.

2. The semiconductor packaging assembly of claim 1, wherein said at least one recess of each of said recess structures has the same dimensions in the direction from said top surface toward said bottom surface.

3. The semiconductor packaging assembly of claim 1, wherein said at least one recess of each of said recess structures has dimensions gradually reduced in the direction from said top surface toward said bottom surface.

4. The semiconductor packaging assembly of claim 3, wherein said at least one recess of each of said recess structures is in a stepwise shape.

5. The semiconductor packaging assembly of claim 1, wherein said at least one recess of each of said recess structures has dimensions gradually increased in the direction from said top surface toward said bottom surface.

6. The semiconductor packaging assembly of claim 5, wherein said at least one recess of each of said recess structures is in a stepwise shape.

7. The semiconductor packaging assembly of claim 1, wherein said at least one recess of each of said recess structures extends through said redistribution layered structure from said top surface to said bottom surface.

8. The semiconductor packaging assembly of claim 1, further comprising a plurality of passive elements disposed on said device regions of said redistribution layered structure.

9. A semiconductor packaging structure, comprising:
a redistribution layered structure which has a top surface and a bottom surface opposite to said top surface, said top surface having a peripheral portion;
a recess structure which has at least one recess and which is formed at said peripheral portion of said top surface, said at least one recess being recessed into said redistribution layered structure and extending in a direction from said top surface toward said bottom surface within said redistribution layered structure, said at least one recess not extending beyond said redistribution layered structure;
a chip disposed on said top surface of said redistribution layered structure and electrically connected to said redistribution layered structure; and
an encapsulating layer formed on said redistribution layered structure to fill said at least one recess and enclose said chip, said encapsulating layer having a cut surface, said recess structure being adjacent to said cut surface.

10. The semiconductor packaging structure of claim 9, wherein:
said redistribution layered structure has a plurality of dielectric segments located at said peripheral portion of said top surface; and
said recess structure has a plurality of said recesses separated from one another by said dielectric segments.

11. The semiconductor packaging structure of claim 10, wherein:
said redistribution layered structure has a side surface which is flush with said cut surface of said encapsulating layer; and
at least one of said dielectric segments forms a part of said side surface of said redistribution layered structure.

12. The semiconductor packaging structure of claim 10, wherein said redistribution layered structure has a side surface which is flush with said cut surface of said encapsulating layer, and a portion of said encapsulating layer filled in said recess structure forms a part of said cut surface of said encapsulating layer.

13. The semiconductor packaging structure of claim 9, wherein:
said redistribution layered structure has a side surface between said top surface and said bottom surface; and
said encapsulating layer surrounds said side surface of said redistribution layered structure.

14. The semiconductor packaging structure of claim 9, wherein said at least one recess of said recess structure has the same dimensions in the direction from said top surface toward said bottom surface.

15. The semiconductor packaging structure of claim 9, wherein said at least one recess of said recess structure has dimensions gradually reduced in the direction from said top surface toward said bottom surface.

16. The semiconductor packaging structure of claim 15, wherein said at least one recess of said recess structure is in a stepwise shape.

17. The semiconductor packaging structure of claim 9, wherein said at least one recess of said recess structure has dimensions gradually increased in the direction from said top surface toward said bottom surface.

18. The semiconductor packaging structure of claim 17, wherein said at least one recess of said recess structure is in a stepwise shape.

19. The semiconductor packaging structure of claim 9, wherein said at least one recess of said recess structure extends through said redistribution layered structure from said top surface to said bottom surface.

20. The semiconductor packaging structure of claim 9, further comprising a passive element disposed on said top surface of said redistribution layered structure.

* * * * *